United States Patent
Chan et al.

(10) Patent No.: US 7,378,600 B2
(45) Date of Patent: May 27, 2008

(54) ELECTRONIC CIRCUIT PROTOTYPING COMPOSITE SUPPORT

(76) Inventors: Eric K. D. Chan, 121 Milliken Meadows Dr., Markham (CA) L3R 0V7; King Sum Chu, 2A, Block 27, Greenwood Terrace, Sui Wo Road, Fo Tan, Hong Kong (CN)

( * ) Notice: Subject to any disclaimer, the term of this patent is extended or adjusted under 35 U.S.C. 154(b) by 522 days.

(21) Appl. No.: 11/079,505

(22) Filed: Mar. 14, 2005

(65) Prior Publication Data
US 2006/0201697 A1  Sep. 14, 2006

(51) Int. Cl.
*H01R 12/04*   (2006.01)
*H05K 1/11*   (2006.01)
(52) U.S. Cl. ...................... 174/262; 361/792
(58) Field of Classification Search ........... 174/260, 174/262–266, 254; 29/837–839, 864
See application file for complete search history.

(56) References Cited

U.S. PATENT DOCUMENTS

| | | | | |
|---|---|---|---|---|
| 4,175,816 A | * | 11/1979 | Burr et al. | 439/400 |
| 4,330,684 A | * | 5/1982 | Hayward | 174/254 |
| 6,459,587 B1 | * | 10/2002 | Chan | 361/728 |

* cited by examiner

*Primary Examiner*—Jeremy C Norris
(74) *Attorney, Agent, or Firm*—David W. Wong

(57) ABSTRACT

A composite support for fabricating a prototype electrical circuit has a rectangular planar board with a plurality of rows and columns of double sided annular toroidal connection eyelets. The planar board is mounted on a rectangular support tray having a well. The connection eyelets of the planar board have a diameter of from 1.30 mm to 1.80 mm. A high temperature sheet material adhered to the entire undersurface of the planar board, which is pierced by leads of electrical components inserted into the connection eyelets. A spongy retainer block or a breadboard may also be located in the support tray well.

8 Claims, 14 Drawing Sheets

ELECTRONIC CIRCUIT PROTOTYPING COMPOSITE SUPPORT

BACKGROUND OF THE INVENTION

1. Field of the Invention

This invention relates to the method and apparatus for making a prototype of an electronic circuit in circuit development particularly for educational and hobby purposes.

2. Background Art

In electronic circuit development, following the establishment of the design, it is necessary to build a prototype of the circuit to conduct testing so as to verify its operation and feasibility. The prototype may be built on a universal printed circuit board having an electrical connection pattern provided therein. The pattern consists of a plurality of rows and columns of relatively small openings having a solder connection eyelet commonly made of copper adhered on only its undersurface commonly referred to as the solder side. The openings typically have a diameter of 0.8 mm just sufficient for the leads of electrical components to be inserted therethrough. Leads of electrical components and connection wires are inserted through the top side commonly referred to as the component side of the board through the openings so that their end portion extend through the board to the undersurface. The end portion of these leads and wires are bent to secure them mechanically initially to the board in order that the board can be turned over so that solder can be applied to secure the component connections to the connection eyelets at its underside. However, in electronic circuit development it is frequently and inherently required to make numerous changes in various components and/or circuit connections during its testing operation. Therefore, a prototype circuit built on a universal printed circuit board would require de-soldering and re-soldering of various electrical components and connection wires to remove them therefrom and to re-attach them thereto. Such process is very awkward and troublesome to carry out and it often results in the destruction of the electrical components such that they are no longer re-usable thereafter for other circuit design projects. Moreover, since the connection eyelets are merely adhered to the board, they would become dislodged from the board by the heat of the soldering iron after several repeated de-soldering and re-soldering operations so that the board may also be no longer re-usable.

Attempts have also been made in using a double sided printed circuit board for prototype electronic circuit fabrication. Such double sided printed circuit board has connection eyelets provided on both the component side and the underside of the board. However, the connection eyelet is of the same small size as in the single sided printed circuit board, which just large enough to allow only one component lead to be inserted tightly therethrough. Commonly, the component leads are inserted into the board from the component side to the underside i.e. the solder side, and the lower end portion of the leads extending below the solder side of the board are then bent to secure them mechanically to the board similar to using a single sided board. Solder is applied to the connection eyelets at the solder side, thus the solder mainly attaches to the connection eyelets at the solder side with a small amount of the solder migrated to the other side of the eyelet by capillary action. Due to the small size of the eyelets, it is very difficult to extract the solder from one side of the eyelet opening when it is necessary to remove a component by de-soldering from underside of the board and it is even more difficult to extract the solder from the inside of the eyelets within the tight space between the component leads and the eyelets. The process would invariably destroy the components and/or the printed circuit board. Accordingly, such double sided printed circuit board with small eyelet openings is also not suitable for fabricating prototype electronic circuit.

The above problems may be obviated by using a peg-board-like support commonly referred to as a "breadboard" for building the prototype. The breadboard is a rectangular plastic board with conductive bus bars located therewithin. A plurality of rows and columns of receptacle openings are formed in the top surface of the breadboard. Spring socket contacts integrally formed with the bus bars are located in the receptacle openings so that lead wires of electronic components such as resistors, inductors, capacitors and transistors, and pins of IC chips may be inserted easily and removably into the receptacle openings for making electrical connections so called tie-points with one another. Also, jumper wires may be inserted into the tie-points for providing additional electrical connections among the electrical components.

However, there are numerous drawbacks in using a breadboard. Firstly, the circuit fabricated on a breadboard is only suitable for temporary testing purposes. Once the operation and feasibility of the circuit have been tested and verified, the circuit must be re-constructed on a universal printed circuit board for permanent use or application. Such re-construction process is time consuming and difficult to carry out as the components lay out and the electrical connections in using a universal printed circuit board usually require complete re-design. The prototype circuit constructed on the breadboard must also be preserved for ready reference while re-constructing the permanent circuit with a universal printed circuit board, so that it necessitates the acquisition of a complete second set of components for the re-construction. Therefore, it not only would incur additional costs to the user but would invariably introduce other unanticipated complications since the operation and feasibility of such second set of components have not been tested. Also, some components used in the breadboard experimenting circuit such as a pre-programmed microcontroller IC chip must be transferred for use in the re-constructed circuit. In such event, the original breadboard circuit could no longer be preserved for reference in the re-construction of the permanent circuit on the printed circuit board. Furthermore, a circuit constructed on a breadboard is often very messy particularly with the necessary use of long input/output wiring for connecting to external devices such as motors, switches and displays, etc., which are not mounted securely on the breadboard but are merely located alongside the breadboard. Thus, it is awkward in moving the circuit constructed on a breadboard from one place to another with all the input/output wires and the unmounted external devices loosely dragging along therewith. Also, installed jumper wires and components may easily become dislodged or their electrical connections may become loose particularly as the circuit is being moved, resulting in an unreliable circuit. Moreover, often due to improper insertion of the lead wires into the tie-points, the connection may be loose or short circuited to neighboring tie-points especially when stranded input/output wires are used. Short circuit between power input wires and other connecting wires is particularly damaging in causing malfunction of the circuit. Such defect is very difficult to trace and correct. An attempt to pull the incorrectly inserted connecting wire from the tie-point may result in deforming or destroying the spring socket contact to render it unusable thereafter.

SUMMARY OF THE INVENTION

It is a principal object of the present invention to provide a method and a composite circuit support construction to facilitate mounting and connection of electrical components thereon for fabricating a prototype electronic circuit for circuit development.

It is another object of the present invention to provide a composite circuit support having a planar board with connection eyelets securely mounted therein such that they will not separate from the planar board by the heat while component leads are being soldered to these connection eyelets.

It is another object of the present invention to provide a composite circuit support operative to accept several electrical leads to be secured to any selected connection eyelet opening for connecting to one another.

It is another object of the present invention to provide a composite circuit support in which solder may be readily applied or removed by top-soldering operation on the component side of the support.

It is another object of the present invention to provide an expandable composite circuit support so that the circuit size may be varied selectively as well as providing secure mounting for external devices to the circuit.

It is yet another object of the present invention is to provide a composite circuit support including a breadboard therein for fabricating a prototype electronic circuit to facilitate testing of its operation and feasibility.

It is another object of the present invention to provide a method and device for fabricating a prototype electronic circuit without requiring re-construction of a permanent circuit after the prototype has been established.

It is still another object of the present invention to provide a composite circuit support having adjusting means for reforming connection leads of electrical components for ensuring proper insertion of their connection leads into the tie-points of the support.

DETAILED DESCRIPTION OF THE PREFERRED EMBODIMENTS

Figure 1:
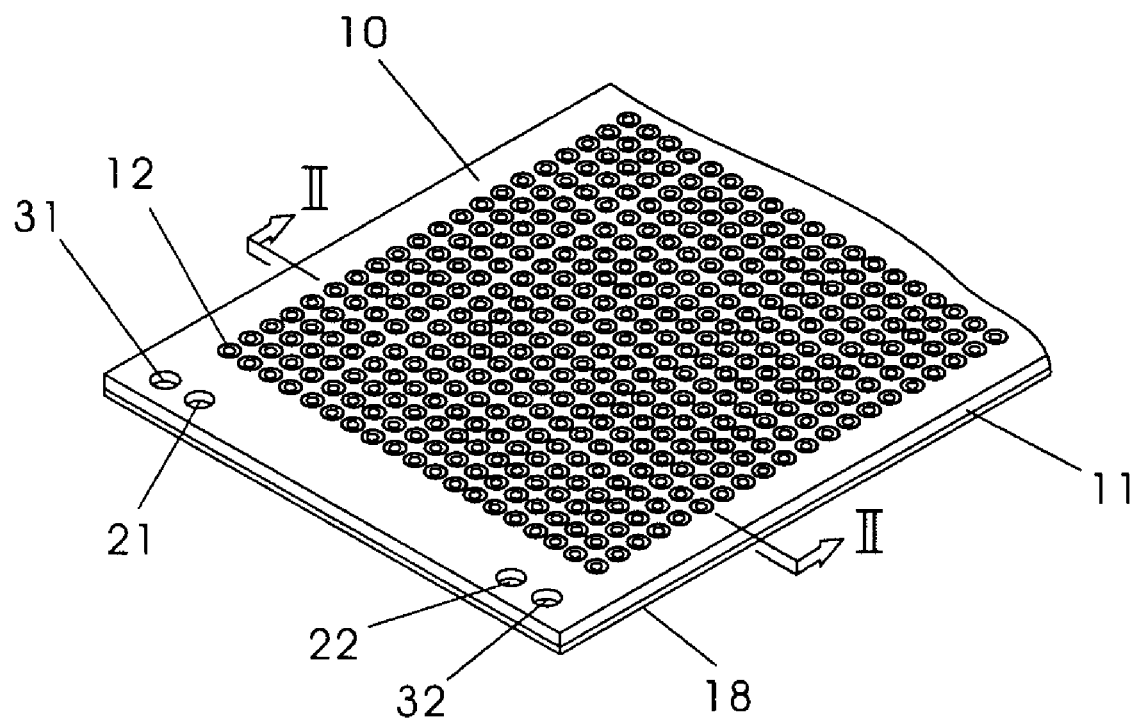
FIG. 1 is a partial perspective top elevation view of the composite circuit support according to the present invention.
Figure 2:
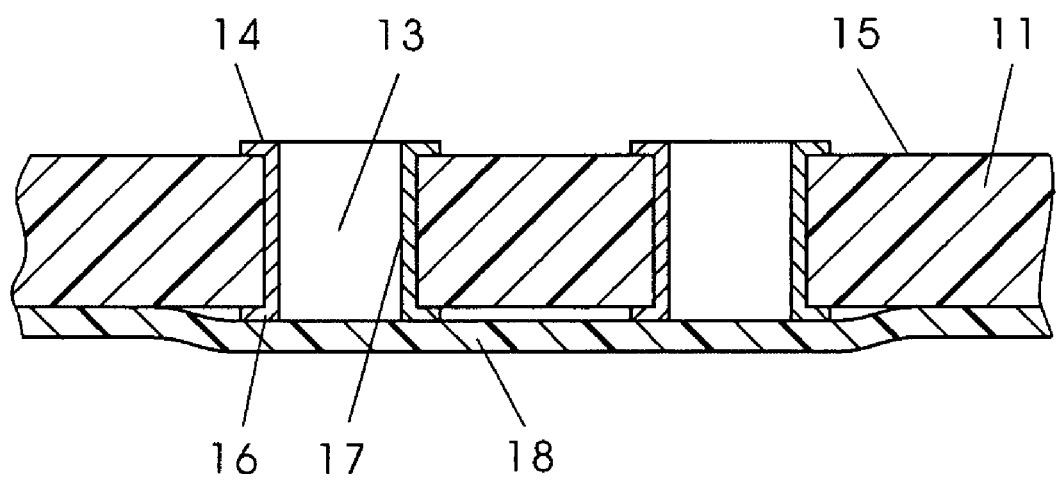
FIG. 2 is a cross sectional elevation partial side view along cross sectional line II-II in FIG. 1.
Figure 3:
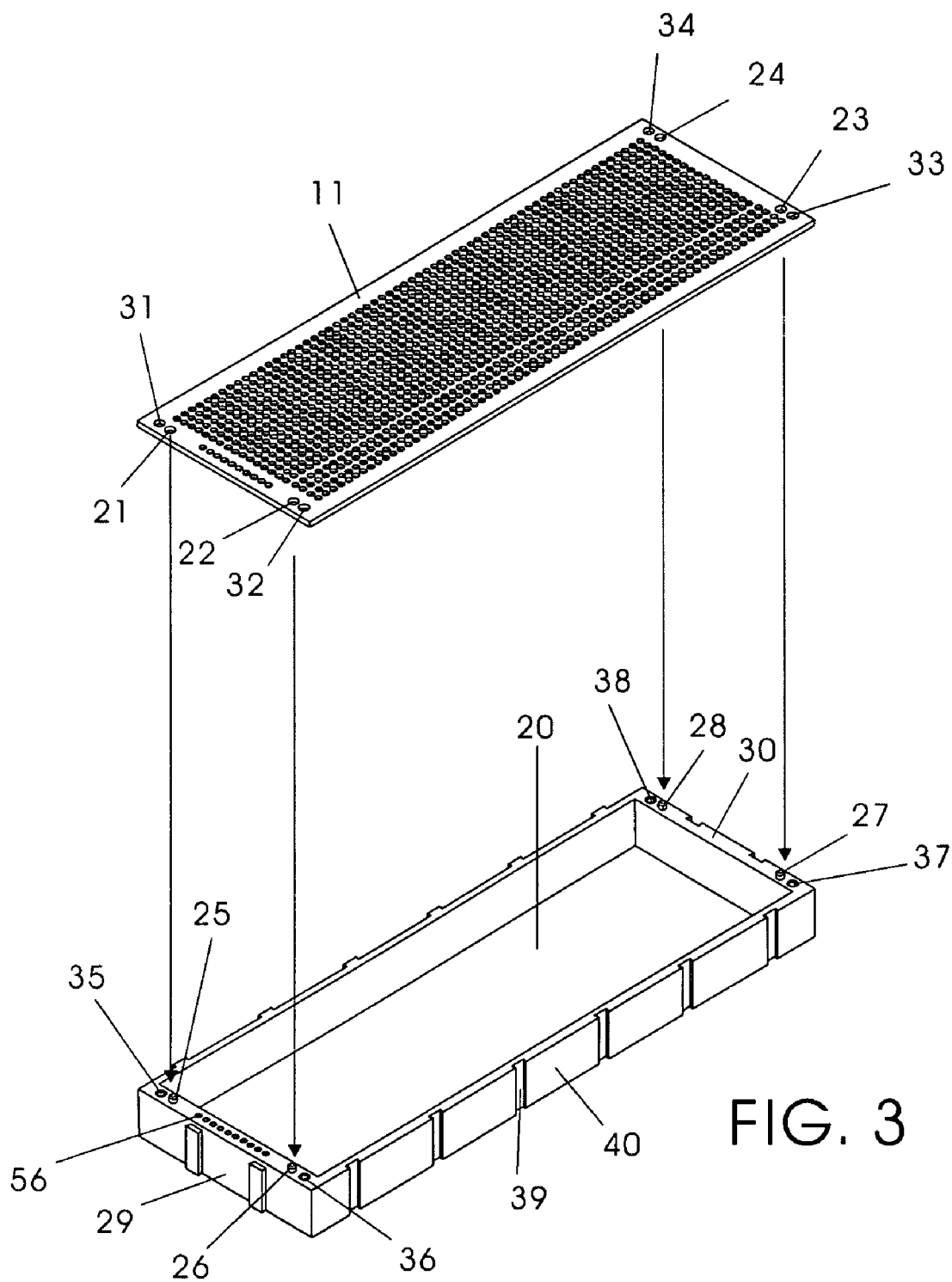
FIG. 3 is an exploded top elevation perspective view of the composite circuit support including a support tray.

With reference to the drawings in which like reference numerals in the several views designate corresponding parts, the composite circuit support 10 of the present invention includes a planar board 11 having a plurality of rows and columns of through connection openings 12 formed therein. The planar board 11 is preferably rectangular in shape and is made of a flame-proof plastic or fibreglass material. An annular toroidal connector 13 is located at each through connection opening 12. The annular toroidal connector 13 is made of metal such as copper which has a high affinity to solder, and it has a first annular eyelet 14 located at the top surface 15 of the planar board 11 and a second annular eyelet 16 located directly at the undersurface of the board 11 and directly below the first annular eyelet 14, and a sleeve portion 17 surrounding the inner side wall of the connection opening 12 and extending between and connected to the first eyelet 14 and second eyelet 16 such that the annular toroidal connectors 13 form a double-sided connection pattern on the planar board 11. The connection opening 12 including the annular toroidal connector 13 has an overall diameter of 1.30 mm to 1.80 mm and a pitch of center-to-center distance of 2.54 mm. A high temperature masking sheet 18 is attached to the entirety of the undersurface of the planar board 11. The masking sheet 18 may be made of a thin plastic material which is adhered and covering over the entire undersurface of the planar board 11. The planar board 11 may be mounted to a rectangular support tray 19 having planar dimensions, i.e. width and length, equal to those of the planar board 11. The support tray 19 has a rectangular well 20 which is located directly under the pattern of connection openings 12 when the planar board 11 is mounted over the support tray 19. Positioning holes 21, 22, 23 and 24 are formed adjacent to the four corners of the planar board 11 which are engageable with upstanding positioning tabs 25, 26, 27 and 28 respectively formed on top of the end walls 29 and 30 of the support tray 19 to ensure the proper positioning of the planar board 11 over the support tray 19. Additional mounting holes 31, 32, 33 and 34 are formed adjacent to the mounting holes 21, 22, 23 and 24 on the planar board 11, which will be aligned with threaded mounting holes 35, 36, 37 and 38 respectively on top of the end walls 29 and 30 such that the planar board 11 may be securely mounted to the support tray 19 with mounting screws after they have been positioned properly with one another.

Figure 4:
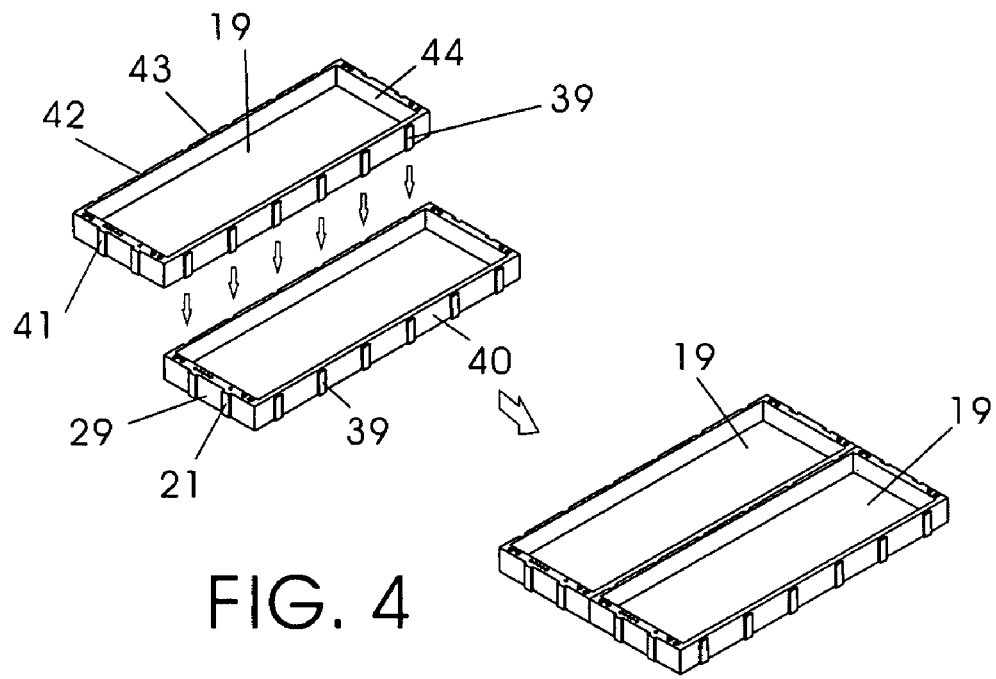
FIG. 4 shows the exploded top views of two support trays according to the present invention securable to one another side by side to provide an expanded circuit support.
Figure 5:
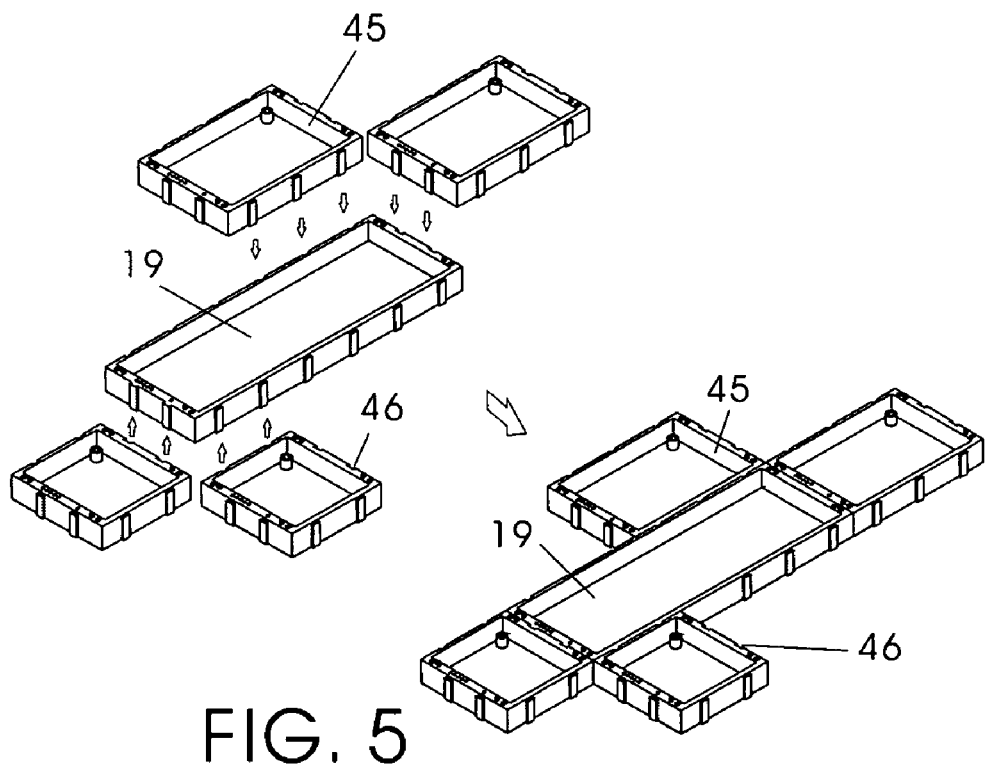
FIG. 5 shows an exploded top elevation perspective view of support trays of various sizes securable to provide an expanded circuit support and/or support for external devices for use with the circuit.
Figure 10:
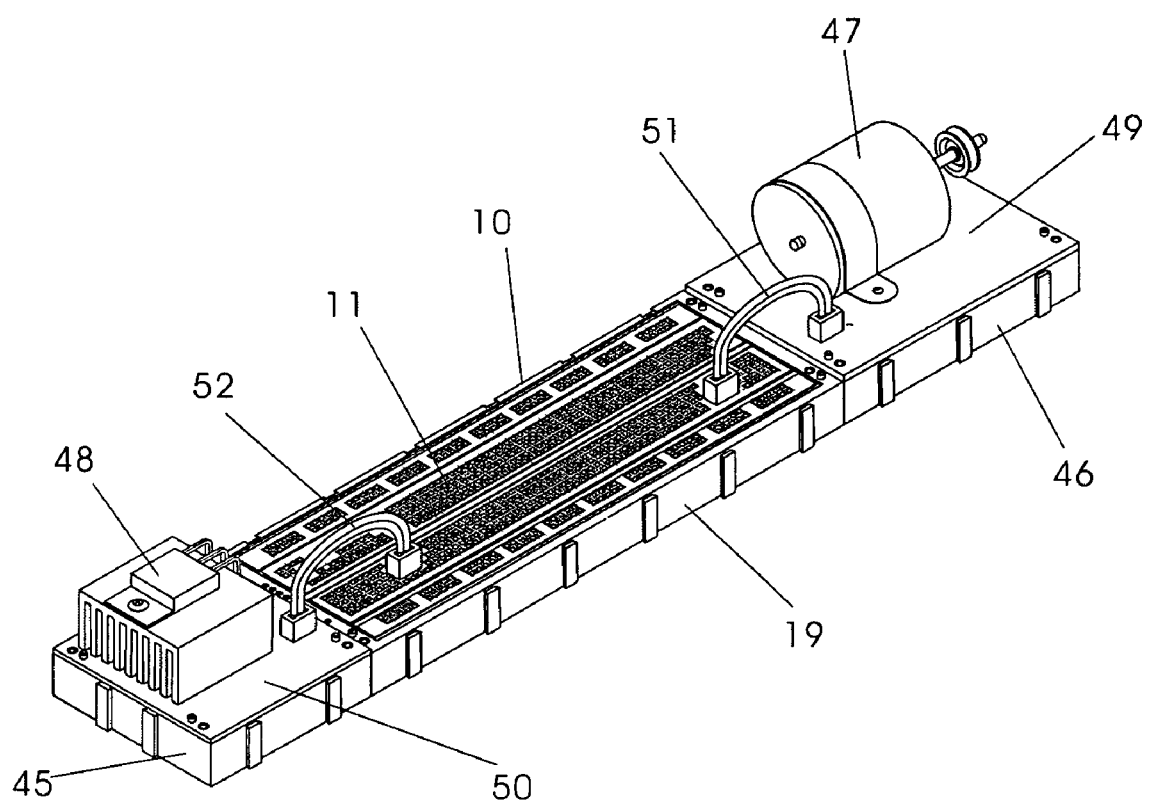
FIG. 10 is a perspective top elevation view of the composite circuit support of the present invention having external device support safely securely to auxiliary support trays mounted to the main support tray.

A plurality of vertical mounting strips 39 are formed on the outer surface of the side wall 40 of the support tray 19. The mounting strips 39 have a trapezoidal horizontal cross sectional shape and are evenly spaced from one another. A plurality of similarly shaped and evenly spaced vertical mounting strips 41 are formed on the end wall 29 of the support tray 19. A plurality of evenly and similarly spaced vertical mounting slots 42 having a complementary trapezoidal horizontal cross sectional shape to the mounting strips 39 are formed on the outer surface of the side wall 43 of the support tray 19, and a plurality of similarly shaped and evenly spaced vertical mounting slots 42 are formed on the outer side wall of the end wall 44 of the support tray 19. Two or more support tray 19 may be securely mounted together side by side by vertically and slidably engaging the vertical mounting strips 39 of one support tray with the vertical mounting slots 42 of the other support tray to form secure dovetail joints for providing a double or more size support tray as best shown in FIG. 4 so that two or more planar boards 11 may be mounted side-by-side to provide a large expanded planar board. Auxiliary support trays 45 and 46 of various sizes are also provided, which also have similar vertical mounting strips and mounting slots formed on their outer side walls and end walls such that they may also be securely mounted to the support tray 19 to provide various extensions of the support tray 19 as best shown in FIG. 5. External devices such as motor 47 and power transistor 48 provided on support plates 49 and 50 may be mounted securely to the auxiliary support trays as best shown in FIG. 10 such that their electrical connection wires 51 and 52 are not subject to movement if the circuit fabricated on the planar board 11 is being moved.

Figure 6:
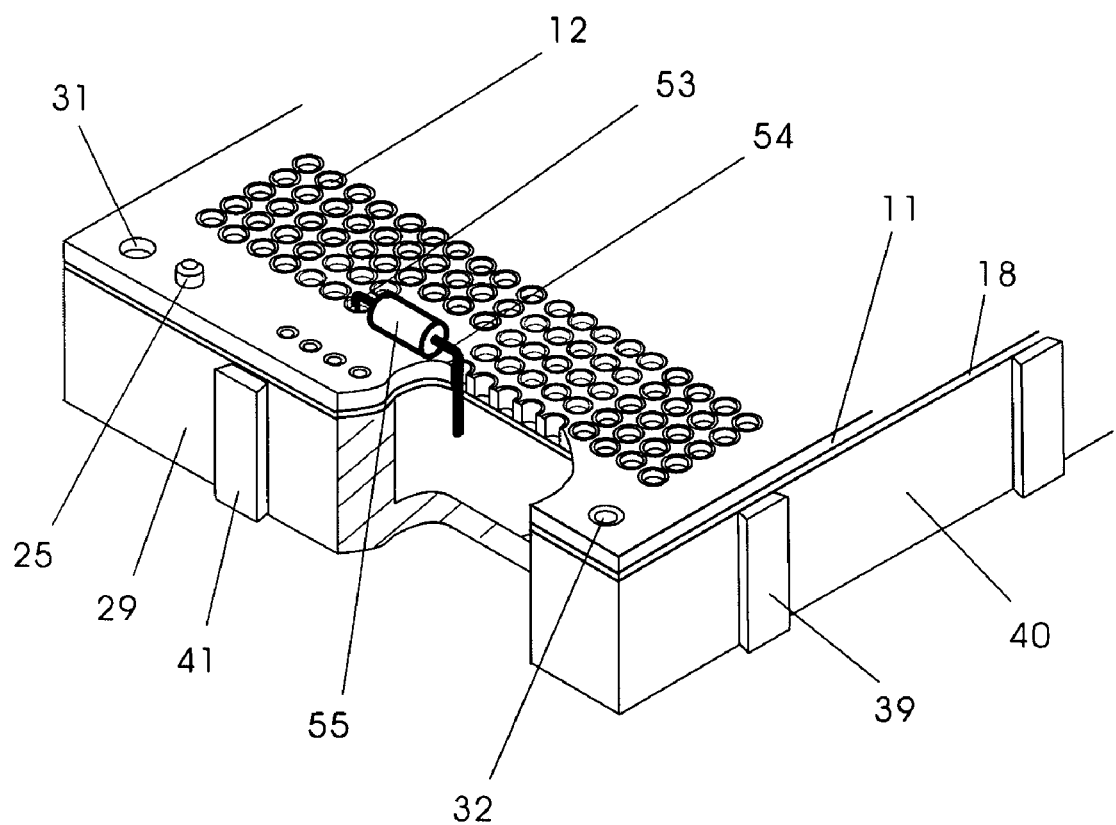
FIG. 6 is an enlarged partial top and end perspective elevation view of the composite circuit support of the present invention with an electrical component secured thereto.

As best shown in FIG. 6, an electronic circuit may be fabricated on the planar board 11 by inserting the leads 53 and 54 of the electrical component 55 into selected connectors 13. The masking sheet 18 will be pierced by the leads 53 and 54 and it will also temporarily maintain the electrical component 55 mounted in place. In this manner, electrical components and connection wires may be mounted on the planar board 11 to form the desired electrical circuit.

Figure 7:
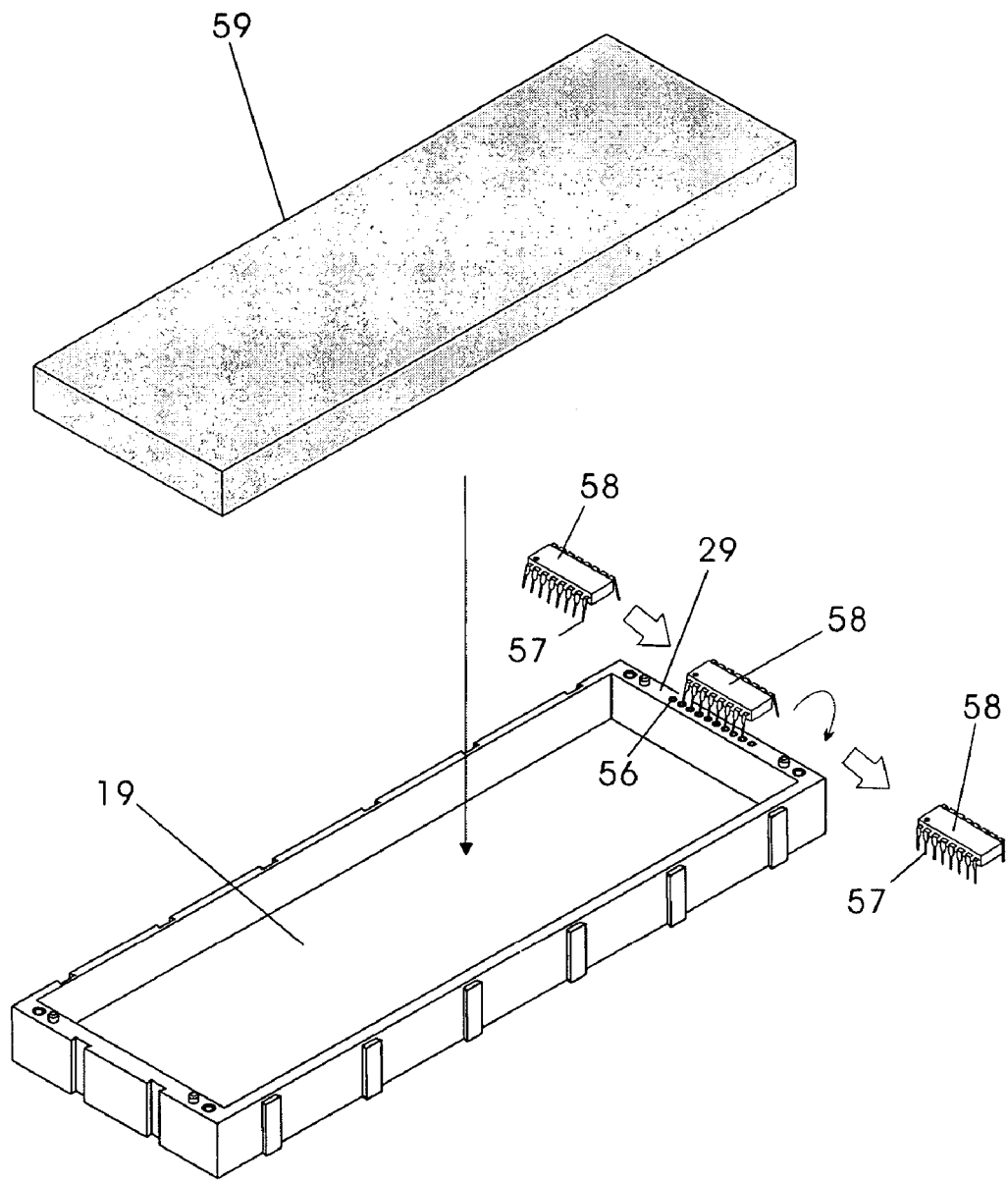
FIG. 7 is an exploded top elevation view of the composite circuit support having a retainer block located within the support tray and electrical component leads adjusting openings formed in the top edge of one end wall of the support tray.
Figure 8:
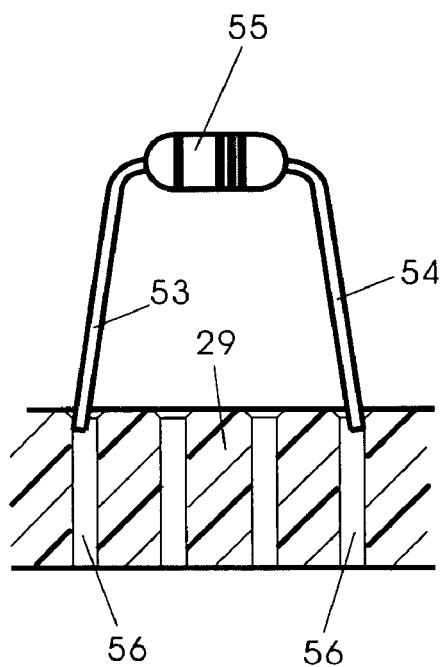
FIGS. 8 and 9 are an enlarged isolated side elevation views showing the insertion of the leads of a resistor into the adjusting openings for re-forming them in order that the component leads may be inserted properly into the composite circuit support.
Figure 9:
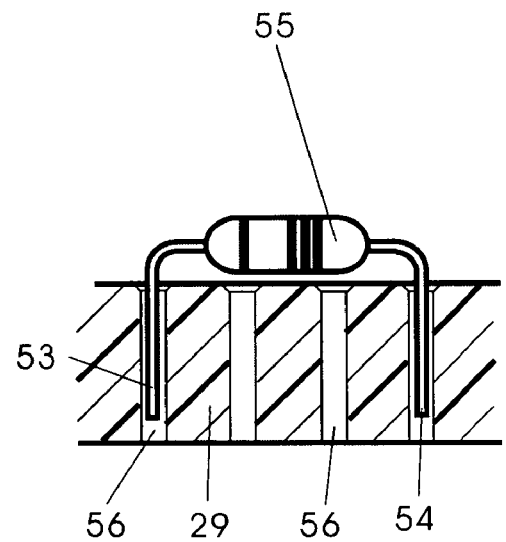

A row of adjustment openings 56 are formed on the top surface of an end wall or side wall of the support tray 19 and they preferably are formed on the top surface of the end wall 29 as shown in FIGS. 3 through 7. The adjustment openings 56 have a diameter of about 0.8 mm with a pitch, i.e. the center to center distance between neighboring openings, of 2.54 mm. These adjustment openings 56 facilitate the reforming or bending of the lead wires 53 and 54 of electrical components such as the resistor 55 as shown in FIGS. 8 and 9 and connection pins 57 of an IC chip 58 as shown in FIG. 7 to the vertical position as well as conforming with the 2.54 mm pitch so that they will engage vertically and properly within the connectors of the connection openings 12 of the planar board 11 when they are inserted into the connectors 13 thus eliminating the danger of the leads and connection wires of neighboring connection eyelets short circuiting to one another or being damaged during insertion or removal.

A rectangular retainer block 59 made of a semi-rigid material such as polystyrene may be additionally located in the well 20 of the support tray 19. The leads of the electrical components will pierce into the retainer block 59 when inserted through the planar board 11 such that they would be more firmly maintained in the mounted position on the planar board.

Figure 11:
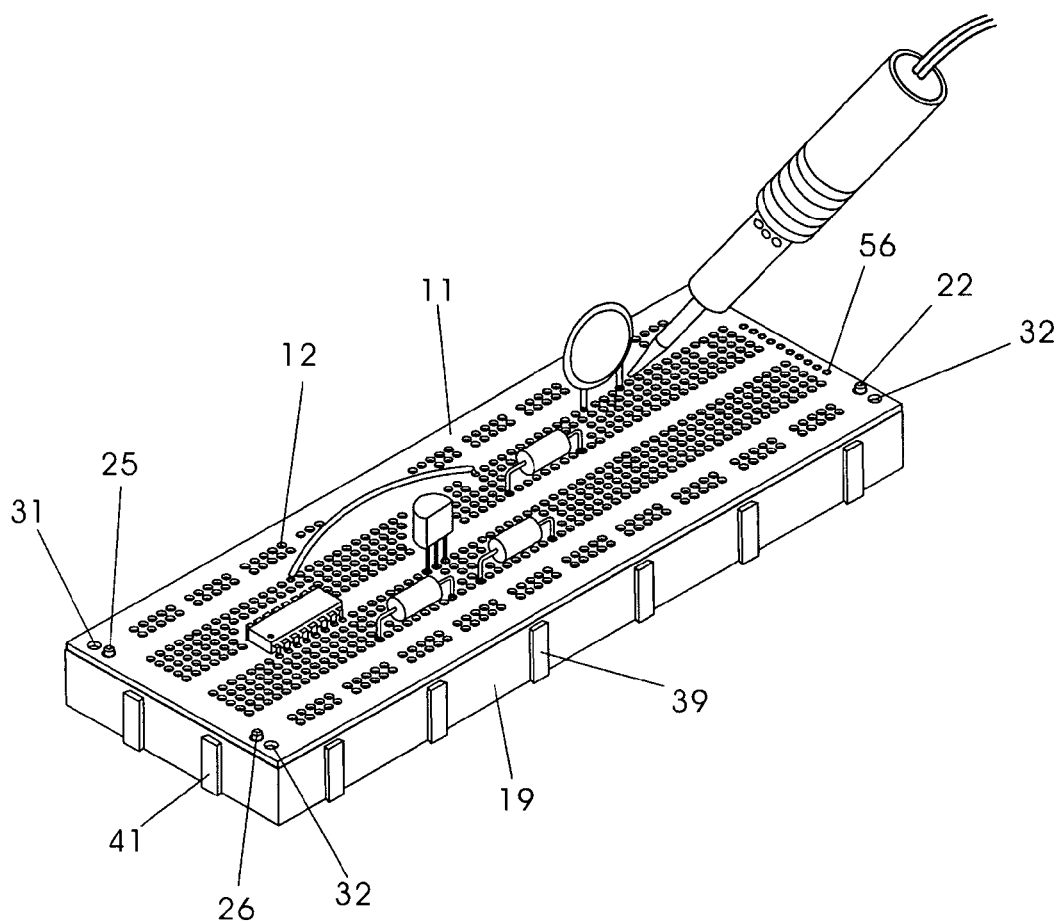
FIG. 11 is a perspective top elevation view showing the application of solder by top-soldering operation to the connection eyelet according to the present invention.
Figure 12:
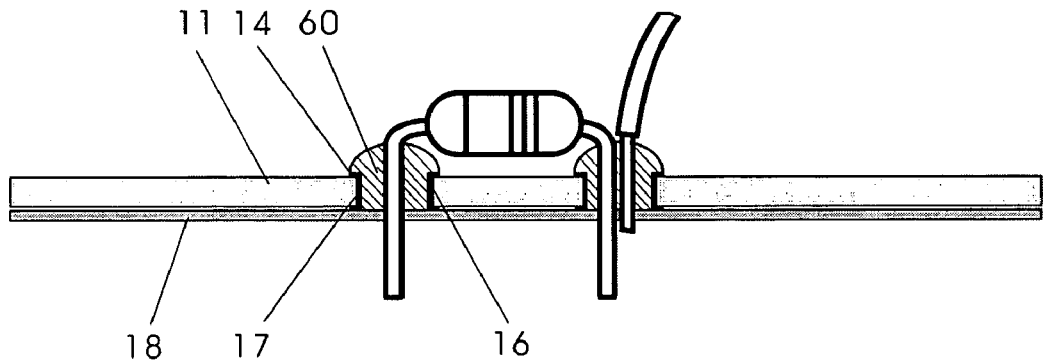
FIG. 12 is an enlarged isolated side elevation view showing the formation of solder at the connection eyelets as well as in the sleeve portion of the annular toroidal connector of the composite circuit support according to the present invention.
Figure 13:
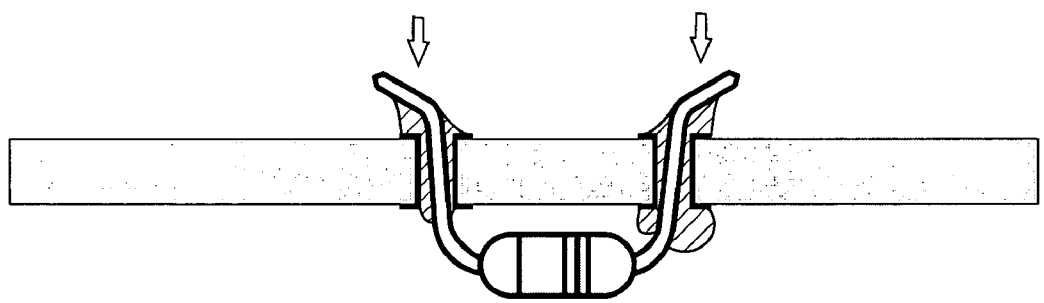
FIG. 13 is an enlarged isolated side elevation view showing the mechanical and solder securement of the leads of the electrical component to a conventional universal single sided printed circuit board.

After the desired electrical circuit has been fabricated by mounting all the electrical components and connection leads to the planar board, the connections to the connectors 13 may then be easily and conveniently soldered by a top soldering operation as best shown in FIG. 11. As best shown in FIG. 12, due to the relatively large connectors 13 provided in the planar board 11, the solder 60 will completely fill also the sleeve portion 17 of the annual toroidal connector 13 to provide a secured and well formed electrical connection. The solder 60 is prevented from falling through the connection openings 12 by the high temperature masking sheet 18 mounted at the underside of the planar board 11. Also, due to the relatively large connection eyelet, the solder 60 may be extracted more easily and completely therefrom if a change of electrical component or connection is to be made. Furthermore, the toroidal shape connectors 13 enhance the secure mounting of the connectors 13 to the planar board 11 such that they will not dislodge from the planar board by the heat of the soldering iron. In comparison with the conventional universal printed circuit board having relatively small single sided connection eyelet as shown in FIG. 13, the solder is mostly formed on such conventional single sided connection eyelet with some solder migrated into board opening in the narrow space between the leads and the board. The solder in the board opening is particularly difficult to extract if the component is to be removed from the printed circuit board. The same problems are also present when using a conventional double sided universal printed circuit board with small connection eyelet openings.

Figure 14:
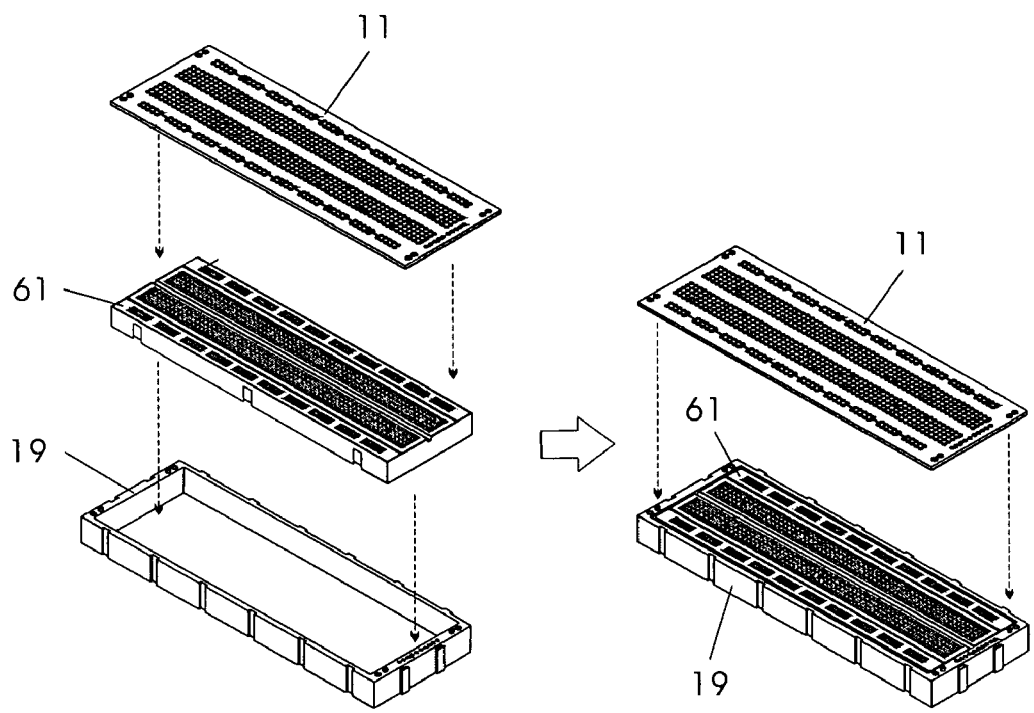
FIG. 14 shows exploded perspective top elevation view of a second embodiment of the composite circuit support having a basic circuit support board, a breadboard and a support tray.
Figure 15:
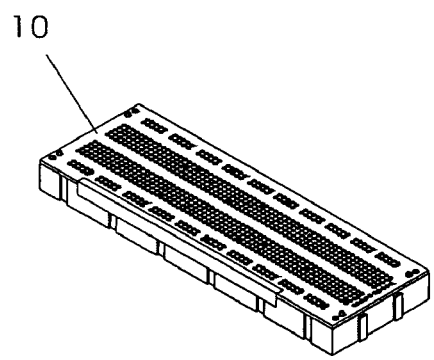
FIG. 15 is a perspective top elevation of the second embodiment of the composite circuit support.
Figure 16:
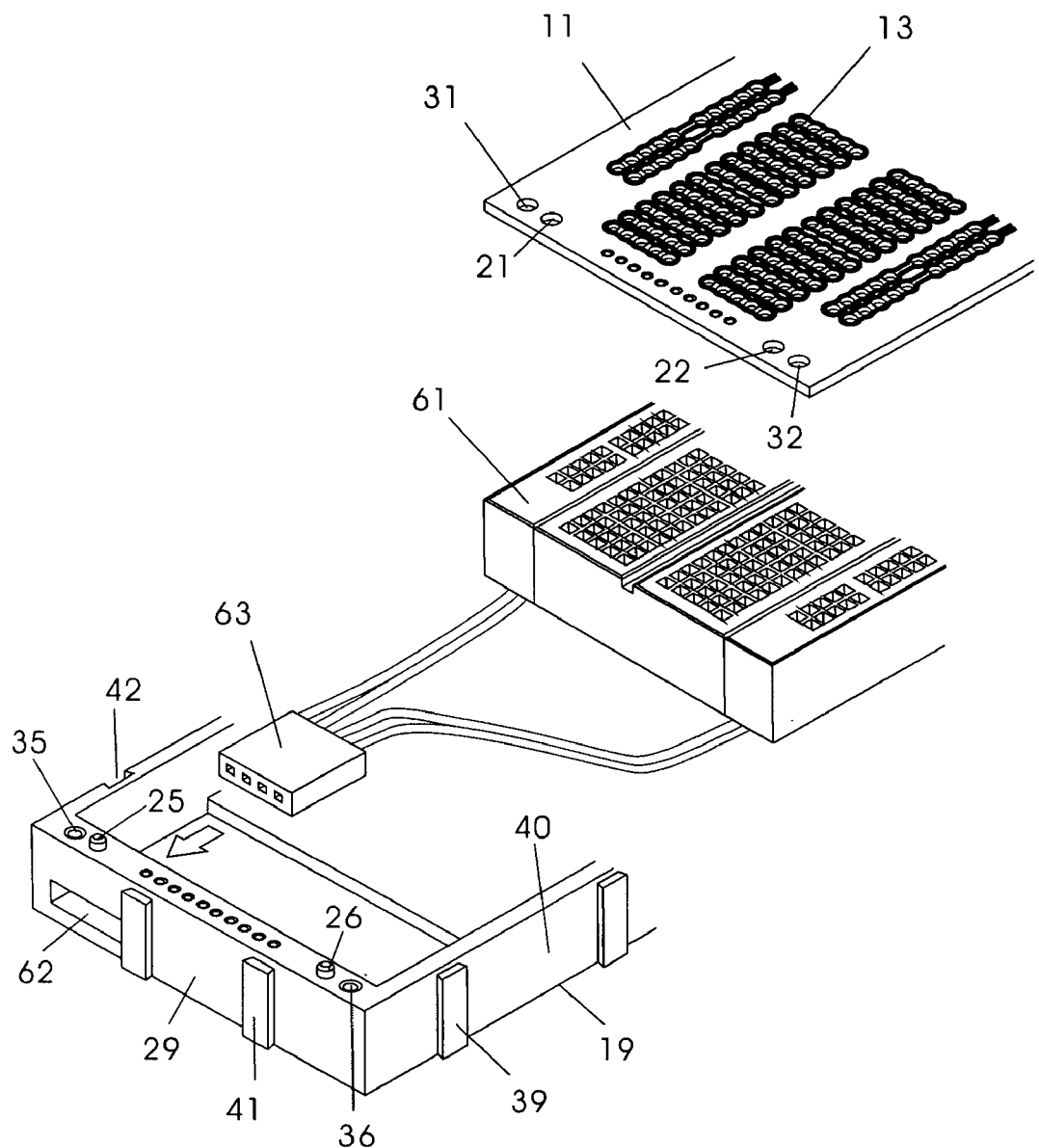
FIG. 16 is an enlarged isolated exploded top and end perspective elevation view of the second embodiment with provision for mounting an electrical connector at the end wall of the support tray.
Figure 17:
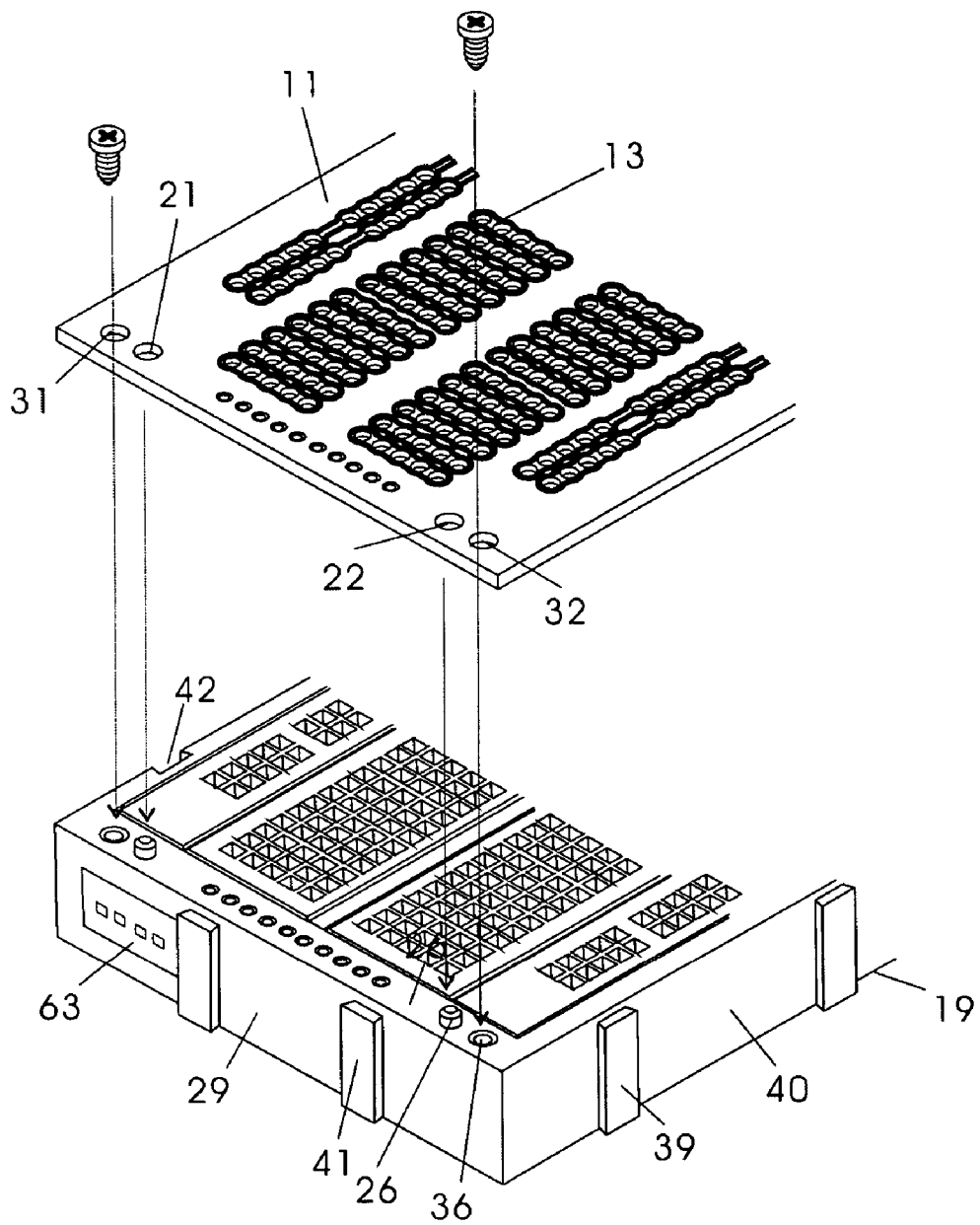
FIG. 17 is an enlarged isolated exploded top and end perspective elevation view of the second embodiment showing the alignment and mounting of the circuit support board to the support tray.
Figure 18:
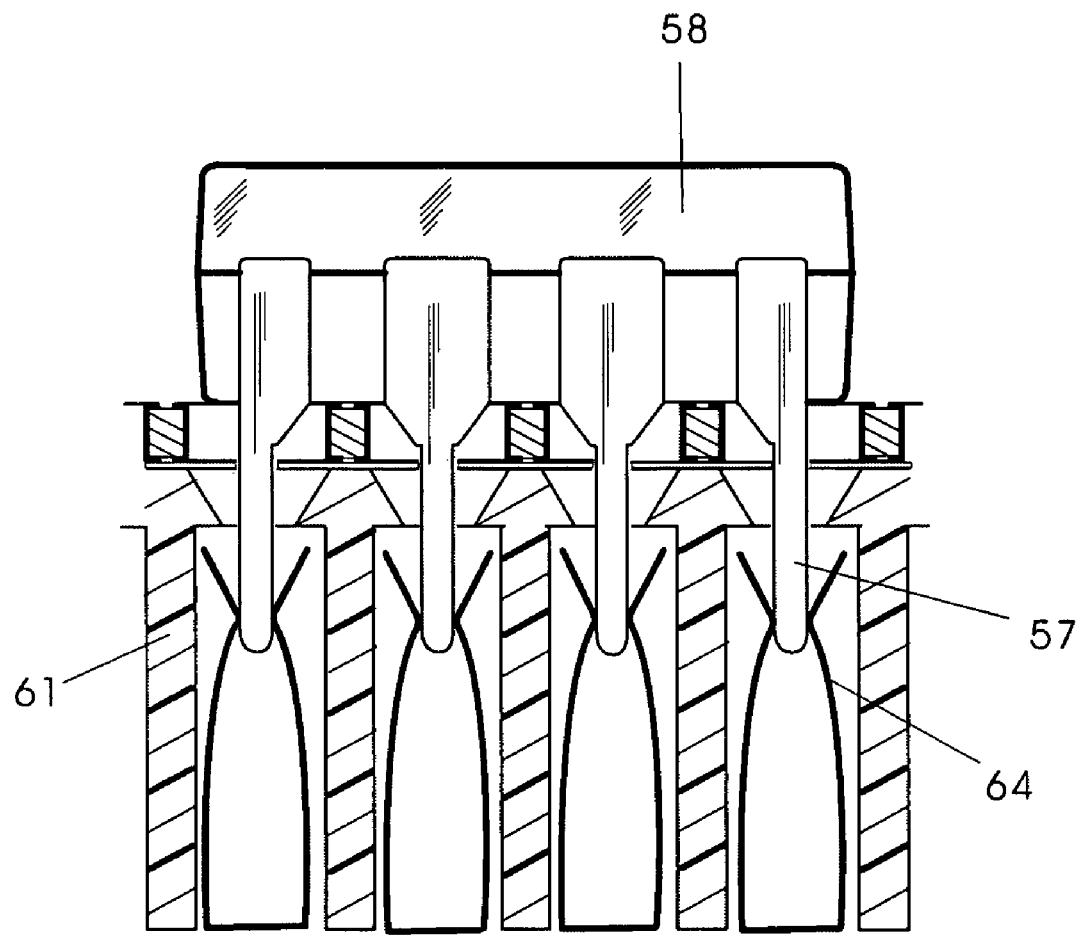
FIG. 18 is an enlarged isolated side elevation view of an IC chip mounted to the composite circuit support of the second embodiment.
Figure 19:
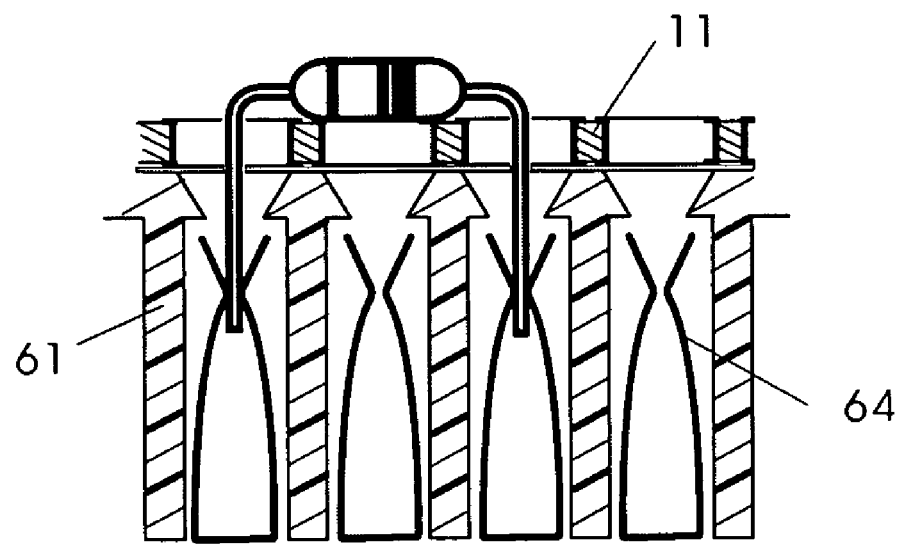
FIG. 19 is an enlarged isolated side elevation view showing the insertion of the leads of a resistor in the connection eyelets of the composite circuit support of the present invention.
Figures 20, 21:
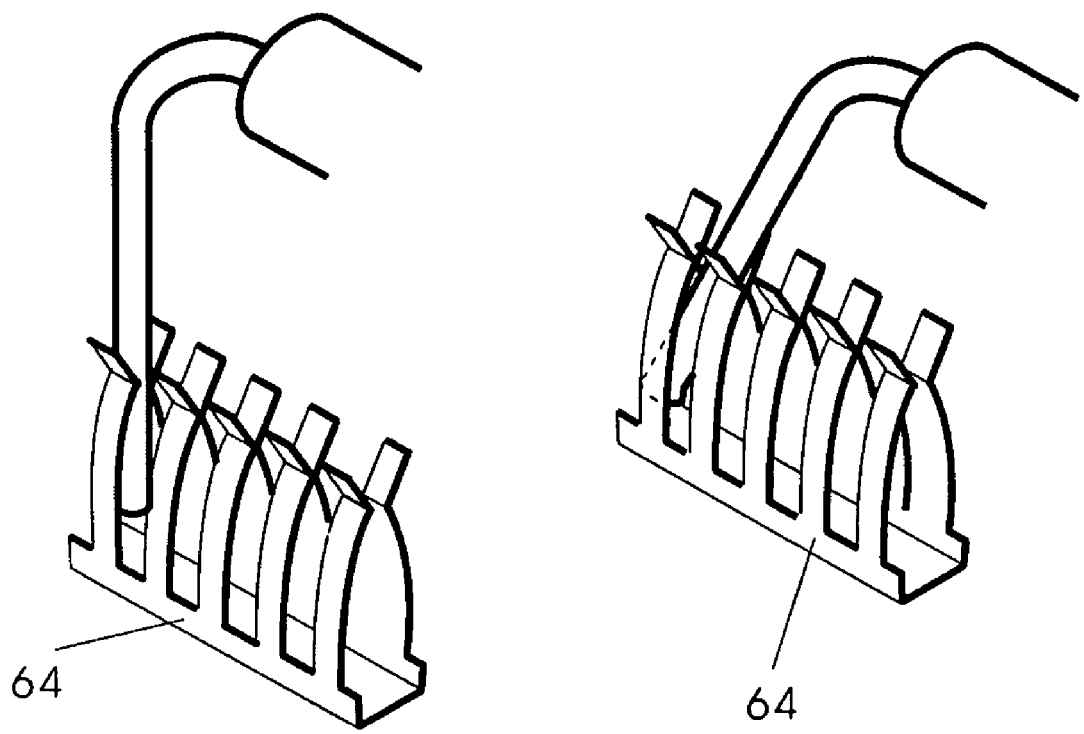
FIG. 20 is an enlarged isolated perspective elevation view showing the proper engaging of a component lead with the spring socket contact in the breadboard when the lead has been properly re-formed and adjusted to the accurate vertical position.
FIG. 21 is an enlarged isolated perspective elevation view showing the component lead touching a neighboring spring socket contact when it is not properly re-formed to the accurate vertical position and is inserted into the breadboard.

In a further embodiment, the composite circuit support of the present invention as best shown in FIGS. 14 and 15, includes a breadboard 61 located in the well 20 of the support tray 19. The planar board 11 has a connection opening pattern identical to that of the breadboard 61 so that their connection openings are aligned with one another when the planar board 11 is mounted to the support tray 19 over the breadboard 61. Mounting openings such as a rectangular opening 62 may be formed in the side wall of the support tray 19 such that an electrical connector 63 connected to component parts in the breadboard 61 may be mounted in the rectangular opening 62 for convenient external electrical connection such as power supply for the circuit formed on the composite circuit support 10. The planar board 11 in this embodiment has a relatively thin maximum 1.0 mm thickness in order to facilitate the insertion of the connection pins of an IC chip 58 such that its connection pins 57 can extend through the planar board 11 and the breadboard 61 to engage with the socket pins 64 located within the breadboard. As shown in FIG. 18, the relatively large connection openings 12 of the planar board 11 also facilitate the larger upper portion of the connection pins 57 of a standard IC chip 58 to be inserted therethrough to ensure the positive engagement of the connection pins 57 with the spring socket contacts 64 in the breadboard 61. The connections are then soldered in place with the top soldering operation. It is particularly important that the component leads must be properly reformed to the vertical position and their pitch conforming with the adjustment openings 56 before inserting into the composite circuit support so that they would engage securely and properly with the spring socket contacts 64 as shown in FIG. 20. A non-adjusted lead may extend to neighboring spring socket contacts to cause damages to the spring socket contacts as shown in FIG. 21.

The prototype electrical circuit fabricated on the composite circuit support of the second embodiment may be tested to verify its operation and feasibility. Once its operation and feasibility have been verified, the planar board 11 with the circuit soldered thereon may be lifted out of the composite circuit support for mounting to a permanent enclosure for use and application. In this manner, re-fabrication of the circuit is not required, and after the removal of the planar board with the circuit permanently formed thereon further testing and verification of the circuit are also not required. Furthermore, the support tray with the breadboard located therein may be readily used for further circuit development.

Of course, the invention is not limited to the embodiments described herein and represented on the attached drawings. Modifications are possible, particularly in relation to the constitution of the various elements or by substitution of equivalent techniques, without in any way departing from the protected domain of the invention.

What we claim is:

1. A composite support for fabricating a prototype electrical circuit comprising:
    a rectangular planar board having a pattern of a plurality of rows and columns of through openings formed therein, said through openings having a center to center distance between neighboring openings of 2.54 mm, and said planar board having a maximum thickness of 1.0 mm,
    annular toroidal connection eyelets mounted in said through openings, each one of said toroidal connection eyelets including a first annular metal ring disposed on a top surface of said planar board, a second annular metal ring disposed on a bottom surface and located directly below said first annular metal ring, and a metal sleeve portion located in said through openings and extending and connected to said first annular ring and said second annular ring,
    said annular toroidal connection eyelets having an inside diameter of from 1.30 mm to 1.80 mm,
    a high temperature sheet material adhered to the entirety of said bottom surface of said planar board and adapted to be pierced by leads of electrical components inserted through said connection eyelets,
    a rectangular support tray having planar dimensions equal to said planer board and adapted for said planar board to be mounted thereon, said support tray having a rectangular well,
    a rectangular breadboad disposed in said rectangular well, said breadboard having a pattern of a plurality of rows and columns of receptacle openings corresponding to said pattern of through openings in said planar board and being aligned with said through openings when said planar board is mounted on said support tray, a plurality of spring socket contacts located within said breadboard and directly below said receptacle openings.

2. A composite support according to claim 1 including positioning openings formed adjacent to four corners of said planar board, and upstanding positioning tabs formed on top surface of end walls of said support tray, said positioning openings and upstanding tabs being engageable with one another for ensuring positioning of said planar board correctly on said support tray.

3. A composite support according to claim 2 including a row of vertically extending adjustment openings formed in a top surface of an end wall of said support tray, a row of associated adjustment openings formed adjacent to an end edge of said planar board, said adjustment openings and said associated adjustment openings being aligned with one another when said planar board is mounted on said support tray.

4. A composite support according to claim 3 including a plurality of vertical mounting strips formed on an outer surface of a first side wail and a first end wall of said support tray, said mounting strips being evenly spaced from one another and having a horizontal cross sectional trapezoidal shape, and a plurality of vertical mounting slots formed in an outer surface of a second side wall and a second end wall of said support tray, said mounting slots having a horizontal cross sectional shape complementary to said horizontal cross sectional trapezoidal shape of said mounting strips, whereby two support trays are mountable to one another side by side by engaging mounting strips of one support fray with mounting slots of the other support tray to provide a composite support of an expanded size.

5. A composite support according to claim 4 said vertical mounting strips and said mounting slots extending throughout the entire height of said side walls and end walls respectively.

6. A composite support according to claim 5 including a plurality of rectangular auxiliary support trays having various sizes and similar in structure to said support tray and being mountable side by side to said support tray for mounting external devices for said circuit.

7. A composite support according to claim 6 including at least one rectangular opening formed in an end wall of said support tray and adapted for receiving an electrical connector to be mounted therein, said electrical connector being connected to electrical components mounted on said composite support.

8. A composite support according to claim 7 wherein said planar board is made of a material selected from a group consisting of flame-proof plastic and fibreglass.

* * * * *